United States Patent [19]

Park et al.

[11] Patent Number: 5,739,049
[45] Date of Patent: Apr. 14, 1998

[54] METHOD FOR FABRICATING SEMICONDUCTOR DEVICE HAVING A CAPACITOR AND A METHOD OF FORMING METAL WIRING ON A SEMICONDUCTOR SUBSTRATE

[75] Inventors: Heung Lak Park; Kyeong Keun Choi, both of Ichon, Rep. of Korea

[73] Assignee: Hyundai Electronics Industries Co., Ltd., Ichon, Rep. of Korea

[21] Appl. No.: 699,253

[22] Filed: Aug. 19, 1996

[30] Foreign Application Priority Data

Aug. 21, 1995 [KR] Rep. of Korea .............. 95-25648
Nov. 1, 1995 [KR] Rep. of Korea .............. 95-39155

[51] Int. Cl.[6] .................................................. H01L 21/00
[52] U.S. Cl. ........................... 438/3; 438/239; 438/240
[58] Field of Search ......................... 437/47–48, 52, 437/60, 919, 192, 195, 198; 438/3, 239, 240, 253, 396

[56] References Cited

U.S. PATENT DOCUMENTS

| 5,330,935 | 7/1994 | Dobuzinsky et al. | 437/239 |
| 5,352,622 | 10/1994 | Chung | 437/52 |
| 5,392,189 | 2/1995 | Fazan et al. | 361/305 |
| 5,407,855 | 4/1995 | Maniar et al. | 437/60 |
| 5,466,629 | 11/1995 | Mihara et al. | 437/60 |
| 5,489,548 | 2/1996 | Nishioka et al. | 437/60 |

OTHER PUBLICATIONS

S. Wolf and R.N. Tauber, "Silicon Processing for the VLSI Era vol. 1—Process Technology", Lattice Press, pp. 388–391 and 547–550, 1986.

Primary Examiner—John Niebling
Assistant Examiner—Joni Y. Chang
Attorney, Agent, or Firm—Reid & Priest LLP

[57] ABSTRACT

A method for fabricating a semiconductor device having a capacitor exhibiting improved insulating and ferroelectric characteristics. The method involves forming a lower insulating layer over a semiconductor substrate, selectively removing the lower insulating layer to form a contact hole, forming a ruthenium film over the lower insulating layer, selectively removing the ruthenium film, thereby forming a lower electrode, and forming a ruthenium oxide film over the lower electrode. A method for forming a metal wiring is also provided. The metal wiring forming method involves forming a first metal layer over a semiconductor substrate provided with a lower insulating layer, forming a ruthenium oxide film over the first metal layer, selectively etching the ruthenium oxide film and the first metal layer, selectively forming a tungsten film on side walls of the selectively-etched first metal layer, forming an insulating film over the resulting structure, selectively removing the insulating layer, thereby forming a contact hole, forming a second metal layer over the resulting structure in such a manner that the second metal layer is connected to the first metal layer through the contact hole.

21 Claims, 4 Drawing Sheets

5,739,049

1

METHOD FOR FABRICATING SEMICONDUCTOR DEVICE HAVING A CAPACITOR AND A METHOD OF FORMING METAL WIRING ON A SEMICONDUCTOR SUBSTRATE

BACKGROUND OF THE INVENTION

1. Field of the Invention

The present invention relates to a method for fabricating semiconductor devices, and more particularly to a method for fabricating semiconductor devices, capable of forming capacitors and metal lines structured to achieve high integration of semiconductor devices.

2. Description of the Prior Art

The recent high integration trend of semiconductor devices inevitably involves a reduction in cell dimension. However, such a reduction in cell dimension causes difficulty in forming capacitors having sufficient capacitance. This is because the capacitance is proportional to the surface area of the capacitor.

In a case of a dynamic random access memory (DRAM) device constituted by one metal oxide semiconductor (MOS) transistor and one capacitor, it is important to reduce the area occupied by the capacitor and still obtain a high capacitance of the capacitor, for the high integration of the DRAM device.

The capacitance C of the capacitor can be expressed by the following equation:

$$C = (Eo \times Er \times A)/T$$

where, Eo represents the dielectric constant in vacuum, Er represents the dielectric constant of the dielectric film, A represents the area of the capacitor, and T represents the thickness of the dielectric film.

As understood from the equation, the capacitance C can be increased by forming the dielectric film using a dielectric material exhibiting a high dielectric constant Er. Using such a dielectric film, high integration of semiconductor devices can be achieved.

Typically, the dielectric film is made of PZT or BST.

When such a dielectric film is used, an under electrode disposed beneath the dielectric film may be made of anti-oxidative platinum. The dielectric film may also be comprised of a ruthenium oxide ($RuO_2$) film or iridium oxide ($IrO_2$) film.

However, it is practically impossible to use platinum for the formation of the dielectric film. This is because platinum is not etched in the etching process.

On the other hand, ruthenium oxide and iridium oxide films are required to have a reduced electrical contact resistance with respect to a silicon diffusion layer because they exhibit a high contact resistance with respect to silicon.

In order to reduce the electrical contact resistance between the ruthenium oxide and silicon diffusion layer, it is necessary to form a low resistance layer comprised of, for example, a laminated structure consisting of titanium/titanium nitride films prior to the deposition of the under electrode.

Where such a low resistance layer is formed, however, there is a degradation in the insulating and ferroelectric characteristics of semiconductor devices. This is because the low resistance layer is in contact with the dielectric layer formed at the next process. As a result, there is a degradation in the characteristic and the reliance of semiconductor devices. It is also difficult to obtain semiconductor devices with a high integration degree.

2

Meanwhile, in the formation of a metal wiring of a semiconductor device in accordance with a well-known conventional method, a copper wiring is first formed on a semiconductor device. A tungsten or fire-resistive nitride film is then formed over the structure including the copper wiring.

Thereafter, the resulting structure is etched in accordance with an etching process using a metal wiring mask in such a manner that the tungsten or fire-resistive nitride film is left on side walls of the etched copper wiring.

Subsequently, an insulating film is formed over the resulting structure to provide a planarized upper surface. The resulting structure is then etched in accordance with an etching process using a metal wiring contact mask, thereby forming a contact hole through which the copper wiring is exposed.

Thereafter, a second metal layer is formed on the resulting structure in such a manner that it is in contact with the copper wiring. Thus, a metal wiring is formed.

In this case, the tungsten or fire-resistive nitride film can not serve to suppress oxygen contained in the insulating film from being diffused into the copper wiring. The tungsten or fire-resistive nitride film rather serves to react with the oxygen, thereby forming an oxide film.

In order to prevent the formation of such an oxide film, the use of an alumina ($Al_2O_3$) film, instead of the tungsten or fire-resistive nitride film has been proposed.

However, such an alumina film, which is a non-conductive film, exhibits a high contact resistance. It is also difficult to completely remove the alumina film. As a result, it is difficult to form a desired contact plug.

This results in a difficulty in the contact process used in the formation of the metal wiring, thereby degrading the characteristic and reliance of semiconductor devices. Consequently, it is difficult to achieve high integration of semiconductor devices.

An example of a conventional method for fabricating a semiconductor device is illustrated in FIG. 1.

FIG. 1 is a sectional view showing a conventional method for forming a capacitor of a semiconductor device.

In accordance with this method, a semiconductor substrate 1 provided with a structure which includes an element-isolating insulating film (not shown), a gate electrode (not shown) and bit lines (not shown) is first prepared, and then, a lower insulating layer 2 is formed over the semiconductor substrate 1 in such a manner that it has a planarized upper surface.

The resulting structure is then etched in accordance with an etching process using a capacitor contact mask (not shown), thereby forming a contact hole 3 through which a desired portion of the semiconductor substrate 1 is exposed.

Thereafter, a low resistance layer 4 is formed over the resulting structure including the contact hole 3. Over the low resistance layer 4, a lower electrode material layer (not shown) is then formed.

Subsequently, the lower electrode material layer and low resistance layer 4 are etched in accordance with an etching process using a storage electrode mask, thereby forming a lower electrode 5 for a storage electrode.

Thereafter, a dielectric film 6 is formed on the lower electrode 5. The dielectric film 6 is made of PZT or BST.

In accordance with this method, however, the dielectric film 6 is in contact with the low resistance layer at area a. As a result, the insulating and ferroelectric characteristics of the low resistance layer and dielectric film are degraded, thereby resulting in difficulty in the high integration of semiconductor devices.

SUMMARY OF THE INVENTION

Therefore, an object of the invention is to solve the above-mentioned problems involved in conventional methods and to provide a method for fabricating a semiconductor device having a capacitor exhibiting improved insulating and ferroelectric characteristics.

Another object of the invention is to provide a method for fabricating a semiconductor device, capable of preventing diffusion of oxygen in an insulating film planarized in the formation of a metal wiring, thereby achieving an improvement in the characteristic and reliance of the metal wiring.

Another object of the invention is to provide a method for fabricating a semiconductor device, capable of improving the characteristic and reliance of the semiconductor device, thereby achieving high integration of the semiconductor device.

In accordance with one aspect of the present invention, a method for fabricating a semiconductor device comprises the steps of: providing a semiconductor substrate; forming a lower insulating layer over the semiconductor substrate; selectively removing the lower insulating layer in accordance with an etching process, thereby forming a contact hole in the lower insulating layer to expose the semiconductor substrate through the contact hole; forming a ruthenium film over the lower insulating layer provided with the contact hole; selectively removing the ruthenium film, thereby forming a lower electrode; and surface-oxidizing the lower electrode, thereby forming a ruthenium oxide film over the lower electrode, so that a capacitor can be formed.

In accordance with another aspect of the present invention, a method for forming a capacitor of a semiconductor device comprises the steps of: providing a semiconductor substrate; forming a lower insulating layer over the semiconductor substrate; selectively removing the lower insulating layer in accordance with an etching process, thereby forming a contact hole in the lower insulating layer to expose the semiconductor substrate through the contact hole; forming a contact plug buried in the contact hole; forming a ruthenium film over the entire exposed upper surface of the resulting structure obtained after the formation of the contact plug; selectively removing the ruthenium film; and surface-oxidizing the selectively-removed ruthenium film, thereby forming a ruthenium oxide film over the ruthenium film, so that a capacitor can be formed.

In accordance with another aspect of the present invention, a method for fabricating a semiconductor device comprises the steps of: a semiconductor substrate provided with an upper surface thereof with a lower insulating layer; forming a first metal layer over the lower insulating layer; forming a ruthenium oxide film over the first metal layer; selectively etching the ruthenium oxide film and the first metal layer; selectively forming a tungsten film on side walls of the selectively-etched first metal layer; forming an insulating film over the entire exposed upper surface of the resulting structure obtained after the selective formation of the tungsten film; selectively removing the insulating layer in accordance with an etching process, thereby forming a contact hole in the insulating layer to expose the first metal layer through the contact hole; forming a second metal layer over the resulting structure obtained after the formation of the contact hole in such a manner that the second metal layer is connected to the first metal layer through the contact hole, so that a metal wiring can be formed.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
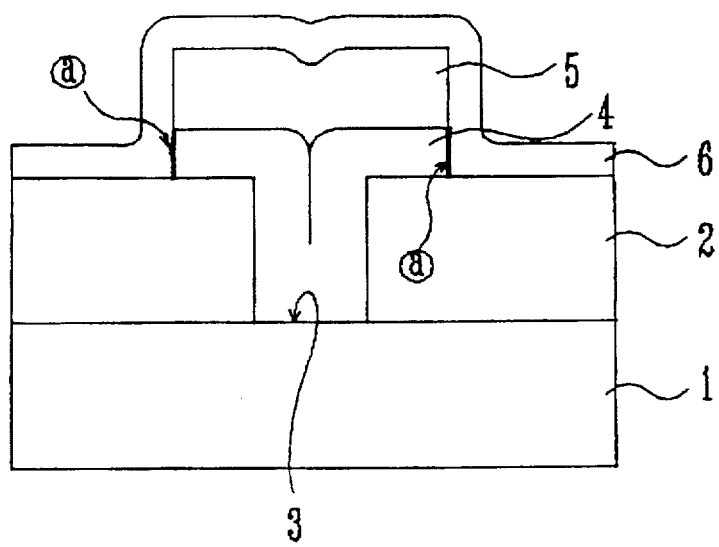
FIG. 1 is a sectional view illustrating a conventional method for forming a capacitor of a semiconductor device.
Figure 2A:
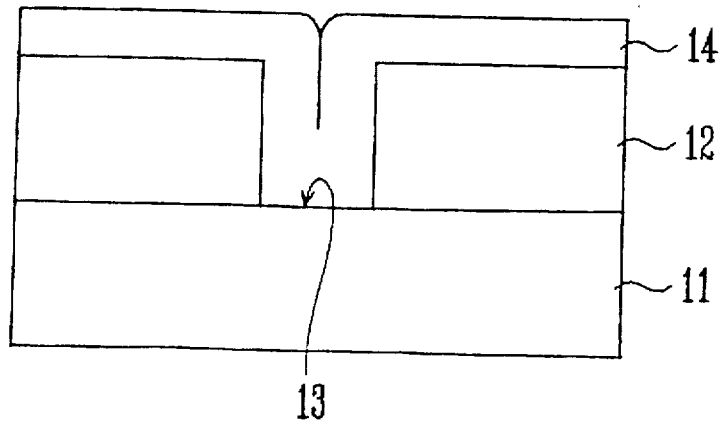
FIGS. 2A to 2C are sectional views respectively illustrating sequential steps of a method for forming a capacitor of a semiconductor device in accordance with a first embodiment of the present invention.
Figure 2B:
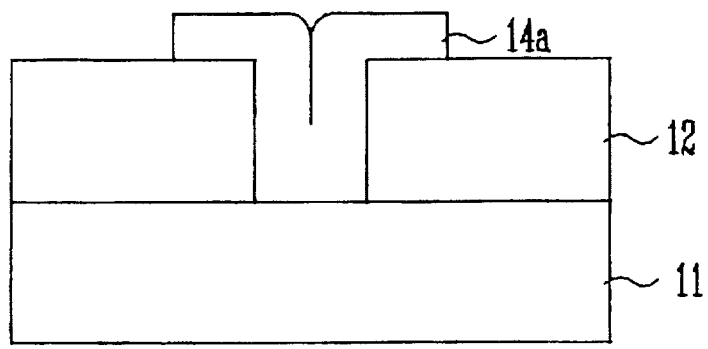
Figure 2C:
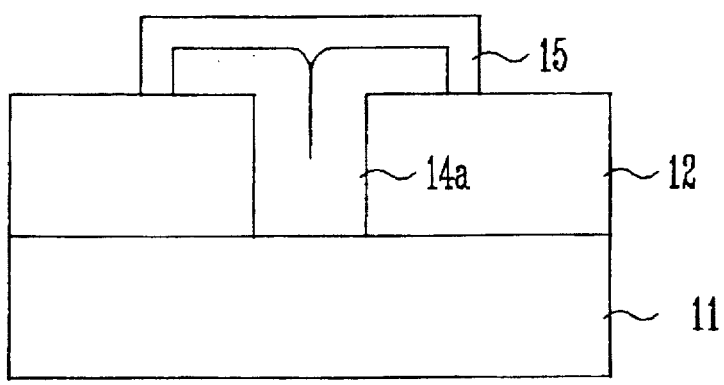

FIGS. 2A to 2C are sectional views respectively illustrating sequential steps of a method for forming a capacitor of a semiconductor device in accordance with a first embodiment of the present invention.

In accordance with this method, a semiconductor substrate 11 is first prepared, and a lower insulating layer 12 is then formed over the semiconductor substrate 11, as shown in FIG. 2A. The formation of the lower insulating layer 12 is achieved by forming a structure which includes an element-isolating insulating film (not shown), a gate electrode (not shown) or bit lines (not shown) on the semiconductor substrate 11, and planarizing the entire exposed surface of the structure by an insulating material having a high flowability.

Thereafter, the resulting structure is etched in accordance with an etching process using a capacitor contact mask (not shown), thus forming a contact hole 13 through which a desired portion of the semiconductor substrate 11 is exposed.

Thereafter, a ruthenium film 14 is formed over the resulting structure, which includes the contact hole 13, so that it can be connected to the semiconductor substrate 11 through the contact hole 13. An iridium film which acts as an oxidative conductor may be used instead of the ruthenium film 14. The ruthenium film 14 has a thickness of about 1,000 to 5,000 Å. The formation of the ruthenium film 14 is achieved by using a sputtering method or chemical vapor deposition (CVD) method. When the sputtering method is used, ruthenium is used as a target. On the other hand, in accordance with the CVD method, the deposition of the ruthenium film is carried out using thermal decomposition of a metal organic compound containing ruthenium. Alternatively, $RuO_4$ may be used in the latter case.

Subsequently, the ruthenium film 14 is etched in accordance with an etching process using a storage electrode mask (not shown), thereby forming a lower electrode 14a as shown in FIG. 2B. The etching of the ruthenium film 14 is carried out using a chemical material such as $Cl_2$, Br or $CF_4$ excited in plasma.

A ruthenium oxide film 15 is formed to a desired thickness over the lower electrode 14a in accordance with a surface oxidation process, as shown in FIG. 2C. Preferably, the ruthenium oxide film 15 has a thickness of about 100 to 1.0000 Å.

The surface oxidization process is carried out by heating the semiconductor substrate 11 to a temperature of about 400° to 800° C. in a glow discharge plasma atmosphere using oxygen or in an oxidative atmosphere using ozone gas.

Although not shown, silicide is formed at areas where the ruthenium film 14 is in contact with the semiconductor substrate 11 while the surface oxidation is carried out. The silicide serves to reduce the contact resistance generated at the contact areas.

Thereafter, a dielectric film (not shown) and an upper electrode (not shown) are sequentially formed over the lower electrode 14a. Preferably, the dielectric film is made of PZT or BST. On the other hand, the upper electrode may be comprised of a ruthenium oxide or iridium oxide film, a characteristic which is similar to the lower electrode 14a. A material exhibiting a conductive characteristic similar to that of the ruthenium oxide or iridium oxide film may be used to form the upper electrode.

Figure 3:
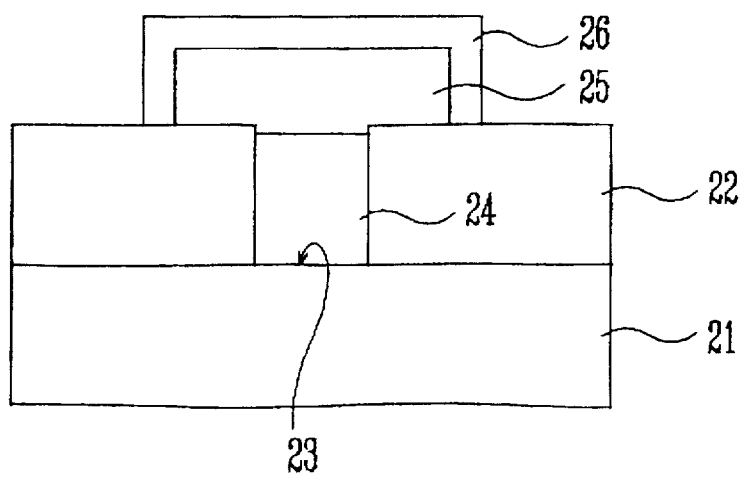
FIG. 3 is a sectional view illustrating a method for forming a capacitor of a semiconductor device in accordance with a second embodiment of the present invention.

FIG. 3 is a sectional view illustrating a method for forming a capacitor of a semiconductor device in accordance with a second embodiment of the present invention.

In accordance with this method, a semiconductor substrate 21 is prepared first, and then a lower insulating layer 22 is formed over the semiconductor substrate 21, as shown in FIG. 3. The formation of the lower insulating layer 22 is achieved by forming a structure including an element-isolating insulating film (not shown), a gate electrode (not shown) or bit lines (not shown) on the semiconductor substrate 21, and planarizing the entire exposed surface of the structure by an insulating material having a high flowability.

The resulting structure is then etched in accordance with an etching process using a capacitor contact mask (not shown), thereby forming a contact hole 23 through which a desired portion of the semiconductor substrate 21 is exposed.

A contact plug 24 is then formed on the resulting structure in such a manner that it is buried in the contact hole 23. Preferably, the contact plug 24 is made of doped polysilicon.

Over the entire exposed surface of the resulting structure, a ruthenium film 25 and a ruthenium oxide film 26 are then sequentially formed. The ruthenium film 25 will be used as a lower electrode. An iridium film and an iridium oxide film may be formed instead of the ruthenium film 25 and the ruthenium oxide film 26.

Thereafter, a dielectric film (not shown) and an upper electrode (not shown) are sequentially formed over the exposed surface of the ruthenium oxide film 26. Preferably, the dielectric film is made of PZT or BST. On the other hand, the upper electrode may be comprised of a ruthenium oxide or iridium oxide film, a characteristic which is similar to the lower electrode 14a. A material exhibiting a conductive characteristic similar to that of the ruthenium oxide or iridium oxide film may be used to form the upper electrode.

FIGS. 4A to 4E are sectional views respectively illustrating sequential steps of a method for forming a metal wiring of a semiconductor device in accordance with a third embodiment of the present invention.

Figure 4A:
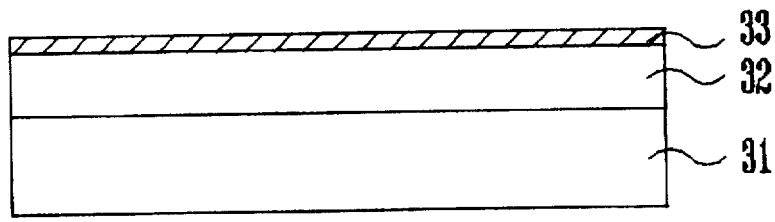
FIGS. 4A to 4E are sectional views respectively illustrating sequential steps of a method for forming a metal wiring of a semiconductor device in accordance with a third embodiment of the present invention.

In accordance with this method, a semiconductor substrate 31 is prepared first, and then a copper layer 32 is formed as a first metal layer over the semiconductor substrate 31, as shown in FIG. 4A. Thereafter, a ruthenium oxide film 33 is formed over the copper layer 32.

The formation of the copper layer 32 is achieved using a sputtering method or a CVD method. Preferably, the copper layer 32 has a thickness of about 2,000 to 4,000 Å. Where the sputtering method is used, the deposition of the copper layer 32 is carried out for 1 to 30 minutes using argon gas and electric power of 50 to 200W (watt) under pressure of about 1 to 50 mTorr. On the other hand, where the CVD method is used, the deposition of the copper layer 32 is carried out for 10 seconds to 10 minutes at a temperature of about 150° to 250° C. using Cu(hfac)(tmvs) as a source material under pressure of about 0.01 to 10 Torr.

Preferably, the ruthenium oxide film 33 is deposited to a thickness of about 50 to 300 Å. The deposition of the ruthenium oxide film 33 is carried out for about 30 seconds to 5 minutes using electric power of about 100 to 1,000W along with argon and oxygen gas in accordance with a DC magnetron sputtering method. In this case, about 5 to 300 sccm of argon gas and about 5 to 100 sccm of oxygen is used. The deposition of the ruthenium oxide film 33 may be achieved in accordance with the CVD method. In this case, the deposition of the ruthenium oxide film 33 is carried out for about 1 to 30 minutes at a temperature of about 100° to 600° C. using Ru(NO) (NO$_3$), RuO$_4$, RuF$_5$ or Ru(C$_5$H$_5$)$_2$ as a source material under pressure of about 1 mTorr to 100 Torr.

Figure 4B:
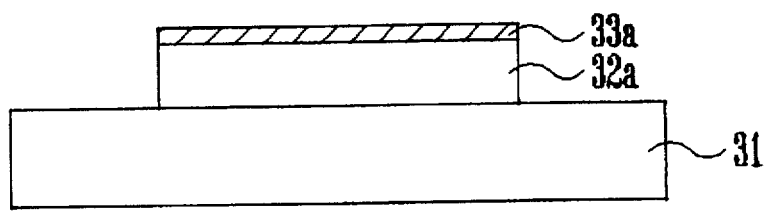
Figure 4C:
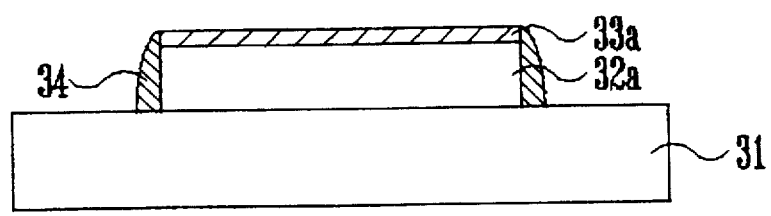

Subsequently, the ruthenium oxide film 33 and copper layer 32 are sequentially etched in accordance with an etching process using a metal wiring mask (not shown), as shown in FIG. 4B A tungsten film 34 is then selectively formed on side walls of the copper layer 32a which was left after completing the etching process of FIG. 4B, as shown in FIG. 4C. The formation of the tungsten film 34 is carried out using WF$_6$/SiH$_4$ gas as a source gas. In this case, the flow ratio of WF$_6$/SiH$_4$ ranges from 10:5 to 20:10 sccm. The tungsten film 34 is deposited to a thickness of about 100 to 1,000 Å at a temperature of about 200° to 400° C. under pressure of about 10 to 500 mTorr.

Figure 4D:
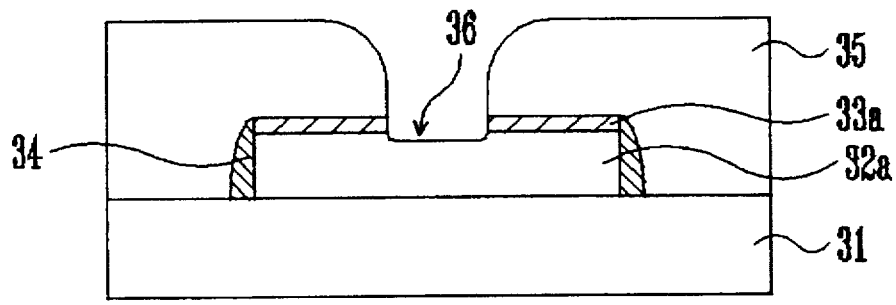

Thereafter, an oxide film 35 is formed to a thickness of about 5,000 to 10,000 Å over the resulting structure to provide a planarized surface, as shown in FIG. 4D. Preferably, the oxide film 35 is made of an insulating material having a high flowability.

The oxide film 35 is then selectively removed, thereby forming a contact hole 36 through which the copper layer 32a as the first metal layer is exposed. The formation of the contact hole 36 is carried out in accordance with an etching process using a metal wiring contact mask (not shown).

Figure 4E:
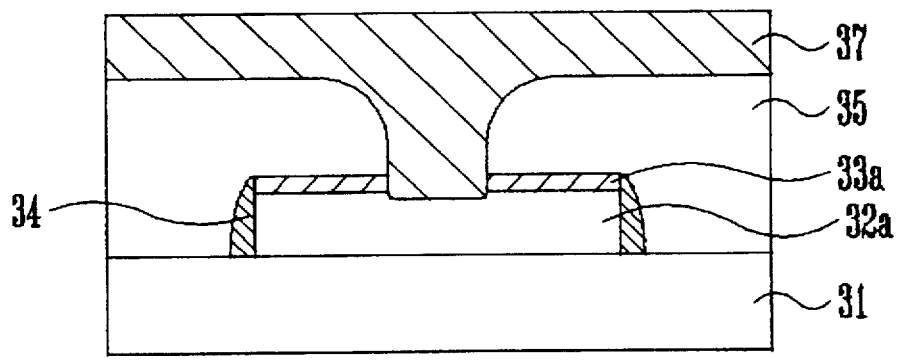

A second metal layer 37 is then formed over the oxide film 35 in such a manner that it is connected to the copper layer 32a as the first metal layer, as shown in FIG. 4E. The second metal layer 37 is made of aluminum, tungsten or copper and has a thickness of about 5,000 to 8,000 Å.

The above-mentioned methods according to the present invention provide various effects.

That is, the capacitor forming method according to the first embodiment of the present invention simplifies the processes used to fabricate a semiconductor device while not only improving the insulating and dielectric characteristics of the semiconductor device, but also reducing the contact resistance.

The capacitor forming method according to the second embodiment of the present invention solves a step coverage problem resulting from high integration of a semiconductor device by use of a contact plug, thereby achieving an improvement in the characteristic and reliance of the semiconductor device.

On the other hand, the metal wiring forming method according to the third embodiment of the present invention does not involve any increase in resistance caused by the material left on the first metal layer in the formation of contacts. This method can also achieve an improvement in the characteristic and reliance of the metal wiring forming process by forming a ruthenium oxide film preventing oxygen contained in the planarizing layer from being diffused into the first metal layer on the first metal layer, and then performing the metal wiring forming process.

As is apparent from the above description, the present invention provides a method for fabricating a semiconductor device, capable of improving the characteristic and reliance of the semiconductor device, thereby achieving high integration of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device having a capacitor, comprising the steps of:

providing a semiconductor substrate;

forming a lower insulating layer over the semiconductor substrate;

selectively removing the lower insulating layer in accordance with an etching process, thereby forming a contact hole in the lower insulating layer to expose the semiconductor substrate through the contact hole;

forming a metal film over said lower insulating layer, in said contact hole and contacting said semiconductor substrate, and wherein said metal is selected from the group consisting of ruthenium and iridium;

selectively removing the metal film, thereby forming a lower electrode; and surface-oxidizing the lower electrode, thereby forming a metal oxide film over the lower electrode, and thereafter forming a dielectric film over the lower electrode.

2. The method in accordance with claim 1, wherein the metal is ruthenium.

3. The method in accordance with claim 1, wherein the metal film is selectively removed by an etching process carried out using $Cl_2$, Br or $CF_4$ excited in plasma while using a storage electrode mask.

4. The method in accordance with claim 1, wherein the surface-oxidizing step is carried out in a plasma atmosphere containing oxygen gas while heating the semiconductor substrate to a temperature of about 400° to 800° C.

5. The method in accordance with claim 1, wherein the surface-oxidizing step is carried out in an oxidative atmosphere containing ozone gas while heating the semiconductor substrate to a temperature of about 400° to 800° C.

6. The method in accordance with claim 2, wherein silicide is formed at areas where the ruthenium film is in contact with the semiconductor substrate at the surface-oxidizing step.

7. A method for forming a semiconductor device having a capacitor, comprising the steps of:

providing a semiconductor substrate;

forming a lower insulating layer over the semiconductor substrate;

selectively removing the lower insulating layer in accordance with an etching process, thereby forming a contact hole in the lower insulating layer to expose the semiconductor substrate through the contact hole;

forming a contact plug buried in the contact hole forming a resulting structure with an exposed upper surface;

forming a metal film in contact with the contact plug over the entire exposed upper surface of the resulting structure obtained after the formation of the contact plug, wherein said metal is selected from the group consisting of ruthenium and iridium;

selectively removing the metal film; and surface-oxidizing the selectively-removed metal film, thereby forming a metal oxide film over the metal film.

8. The method in accordance with claim 7, wherein the contact plug is made of a doped polysilicon.

9. The method in accordance with claim 7, wherein the metal is ruthenium.

10. The method in accordance with claim 7, wherein the metal is selectively removed by an etching process carried out using $Cl_2$, Br or $CF_4$ excited in plasma while using a lower electrode mask.

11. The method in accordance with claim 7, wherein the surface-oxidizing step is carried out in a plasma atmosphere containing oxygen gas while heating the semiconductor substrate to a temperature of about 400° to 800° C.

12. The method in accordance with claim 7, wherein the surface-oxidizing step is carried out in an oxidation atmosphere containing ozone gas while heating the semiconductor substrate to a temperature of about 400° to 800° C.

13. The method in accordance with claim 9, wherein silicide is formed at areas where the ruthenium film is in contact with the contact plug; and further comprising the step of forming a dielectric film over the exposed surface of the metal oxide film.

14. A method for fabricating a semiconductor device having metal wiring, comprising the steps of:

providing a semiconductor substrate provided with an upper surface thereof with a lower insulating layer;

forming a first metal layer over the lower insulating layer;

forming a ruthenium oxide film over the first metal layer;

selectively etching the ruthenium oxide film and the first metal layer;

selectively forming a tungsten film on side walls of the selectively-etched first metal layer to form a resulting structure with an exposed upper surface;

forming an insulating film over the entire exposed upper surface of the resulting structure obtained after the selective formation of the tungsten film;

selectively removing the insulating film in accordance with an etching process, thereby forming a contact hole in the insulating layer to expose the first metal layer through the contact hole;

forming a second metal layer over the resulting structure obtained after the formation of the contact hole in such a manner that the second metal layer is connected to the first metal layer through the contact hole.

15. The method in accordance with claim 14, wherein the first metal layer is made of a copper material and the formation of the copper layer is carried out for 1 to 30 minutes using argon gas and electric power of 50 to 200 W under a pressure of about 1 to 50 mTorr in accordance with a sputtering method.

16. The method in accordance with claim 14, wherein the formation of the copper layer is carried out for 10 seconds to 10 minutes at a temperature of about 150° to 250° C. using Cu(hfac)(tmvs) as a source material under a pressure of about 0.01 to 10 mTorr in accordance with a chemical vapor deposition method.

17. The method in accordance with claim 14, wherein the ruthenium oxide film is formed to a thickness of about 50 to 300 Å.

18. The method in accordance with claim 14, wherein the formation of the ruthenium oxide film is carried out for about 30 seconds to 5 minutes using electric power of about 100 to 1,000 W along with about 5 to 300 sccm of argon gas and about 5 to 100 sccm of oxygen gas in accordance with a direct current DC magnetron sputtering method.

19. The method in accordance with claim 14, wherein the formation of the ruthenium oxide film is carried out for about 1 to 30 minutes at a temperature of about 100° to 600° C. using Ru (NO) (NO$_3$), RuO$_4$, RuF$_5$ or Ru(C$_5$H$_5$)$_2$ as a source material under a pressure of 1 mTorr to 100 Torr.

20. The method in accordance with claim 14, wherein the tungsten film is formed to a thickness of about 100 to 1,000 Å using WF$_6$/SiH$_4$ gas in a flow ratio ranging from 10:5 to 20:10 at a temperature of about 200° to 400° C. under a pressure of about 10 to 500 mTorr.

21. The method of claim 1 wherein said metal is iridium.

* * * * *